United States Patent
Ersek et al.

(10) Patent No.: US 10,302,462 B2
(45) Date of Patent: May 28, 2019

(54) DEVICE AND METHOD TO DEFINE AND IDENTIFY ABSOLUTE MECHANICAL POSITION FOR A ROTATING ELEMENT

(71) Applicants: ROBERT BOSCH GMBH, Stuttgart (DE); ROBERT BOSCH ENGINEERING AND BUSINESS SOLUTIONS LTD., Koramangala, Bangalore (IN)

(72) Inventors: Zoltan Ersek, Korntal-Muenchingen (DE); Arunkumar Motaganahalli Srinivasamurthy, Stuttgart (DE); Shadakshara P. Murthy, Karnataka Bangalore (IN)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/518,897

(22) PCT Filed: Sep. 21, 2015

(86) PCT No.: PCT/EP2015/071571
§ 371 (c)(1),
(2) Date: Apr. 13, 2017

(87) PCT Pub. No.: WO2016/058787
PCT Pub. Date: Apr. 21, 2016

(65) Prior Publication Data
US 2017/0241813 A1  Aug. 24, 2017

(30) Foreign Application Priority Data
Oct. 13, 2014 (IN) .............. 5137/CHE/2014

(51) Int. Cl.
*G06F 1/00* (2006.01)
*G01D 5/249* (2006.01)
(Continued)

(52) U.S. Cl.
CPC ......... *G01D 5/2495* (2013.01); *G01D 5/2449* (2013.01); *G01D 5/2492* (2013.01);
(Continued)

(58) Field of Classification Search
CPC ... G01D 1/00; H02K 1/00; G01R 1/00; G01L 1/00; G01L 7/00; H01L 21/00
See application file for complete search history.

(56) References Cited

U.S. PATENT DOCUMENTS 6,522,130 B1   2/2003  Lutz
2004/0036440 A1* 2/2004  Kim ................. H02K 11/00
                                                318/701
(Continued)

FOREIGN PATENT DOCUMENTS

DE  10 2006 060 622 A1  6/2008
EP      1 923 670 A1    5/2008
(Continued)

OTHER PUBLICATIONS

International Search Report corresponding to PCT Application No. PCT/EP2015/071571, dated Dec. 15, 2015 (German and English language document) (4 pages).

*Primary Examiner* — Jermele M Hollington
*Assistant Examiner* — Temilade S Rhodes-Vivour
(74) *Attorney, Agent, or Firm* — Maginot, Moore & Beck LLP

(57) ABSTRACT

The various embodiment of the present disclosure provides a system to define and identify an absolute mechanical reference position for a rotating element, The system comprises a radial ring magnet comprising plurality of pole pairs mounted to the rotating element, a first magnetic sensor in proximity of the radial ring magnet to detect angular position of said rotating element, at least one second magnetic sensor in proximity of the radial ring magnet to detect the passage of each of the pole pair and a control module adapted to define said absolute mechanical position by computing a unique first set of feature values for each of said plurality of pole pairs based on responses of said first (Continued)

magnetic sensor and said second magnetic sensor. The first set of feature values is stored in a memory unit.

9 Claims, 4 Drawing Sheets

(51) Int. Cl.
*G01D 5/244* (2006.01)
*H01L 21/00* (2006.01)

(52) U.S. Cl.
CPC ..... *G01D 5/24452* (2013.01); *G01D 5/24471* (2013.01); *G06F 1/00* (2013.01); *H01L 21/00* (2013.01); *H01L 2221/00* (2013.01)

(56) References Cited

U.S. PATENT DOCUMENTS

| | | |
|---|---|---|
| 2009/0326860 A1 | 12/2009 | Hainz et al. |
| 2010/0239201 A1* | 9/2010 | Nakajima ........... F16C 33/7879 384/446 |
| 2010/0308804 A1* | 12/2010 | Ghislanzoni ............. G01D 1/00 324/207.23 |
| 2012/0313635 A1* | 12/2012 | Daubert ............. G01R 33/0029 324/251 |
| 2014/0028294 A1* | 1/2014 | Granig ................... G01D 5/145 324/207.12 |
| 2014/0163923 A1* | 6/2014 | Takaki ................... G01D 5/244 702/151 |

FOREIGN PATENT DOCUMENTS

| | | |
|---|---|---|
| EP | 2 559 971 A1 | 2/2013 |
| WO | 92/03877 A1 | 3/1992 |
| WO | 2005/119179 A1 | 12/2005 |
| WO | 2008/101702 A1 | 8/2008 |
| WO | 2009/120507 A2 | 10/2009 |

* cited by examiner

DEVICE AND METHOD TO DEFINE AND IDENTIFY ABSOLUTE MECHANICAL POSITION FOR A ROTATING ELEMENT

This application is a 35 U.S.C. § 371 National Stage Application of PCT/EP2015/071571, filed on Sep. 21, 2015, which claims the benefit of priority to Application No. 5137/CHE/2014, filed on Oct. 13, 2014 in India, the disclosures of which are incorporated herein by reference in their entireties.

FIELD OF THE INVENTION

The present disclosure relates to a device and method for defining and identifying an absolute mechanical reference position for a rotating element.

BACKGROUND OF THE INVENTION

According to a prior art with U.S. Pat. No. 6,522,130, an inexpensive and accurate device for sensing rotor position and detecting rotational speed over a broad range of speeds in an electric motor includes a sense ring magnet and two analog Hall effect sensors. The sense ring is magnetized in an alternating north-south fashion with a number of poles that correspond to a number of motor field poles. The Hall Effect sensors are placed so that they measure magnetic flux tangential to the sense ring.

BRIEF DESCRIPTION OF THE ACCOMPANYING DRAWINGS

Figure 1:
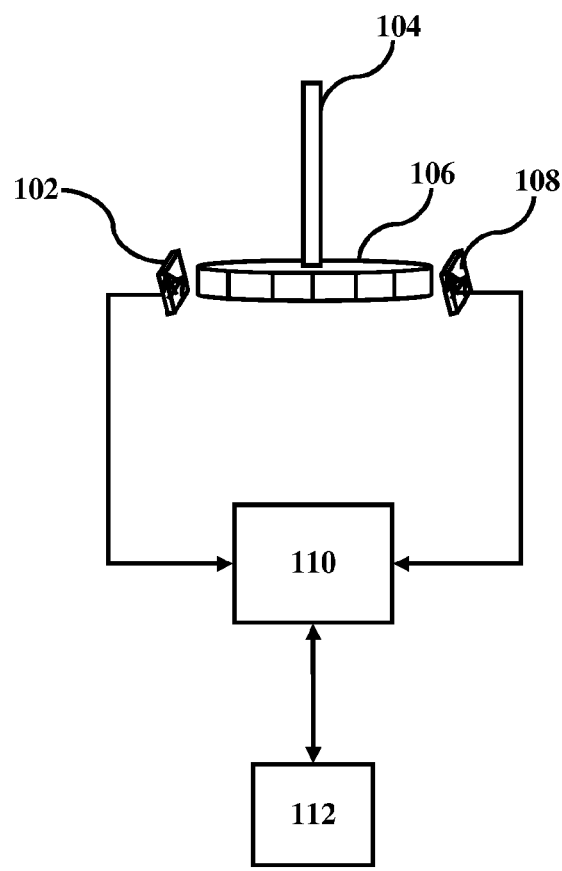
Figure 2:
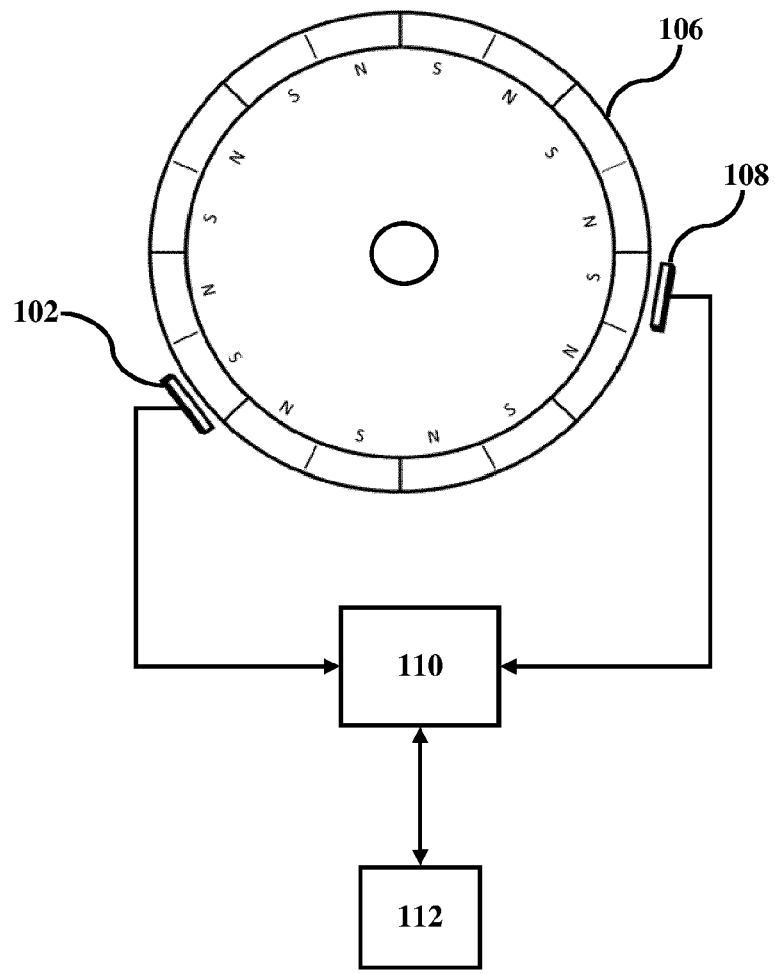
Figure 3:
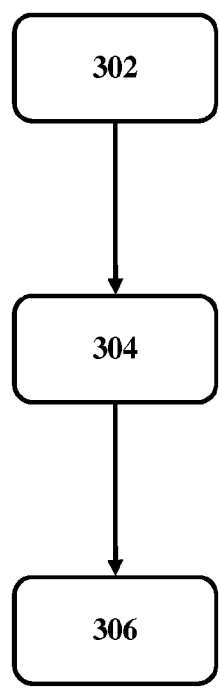
Figure 4:
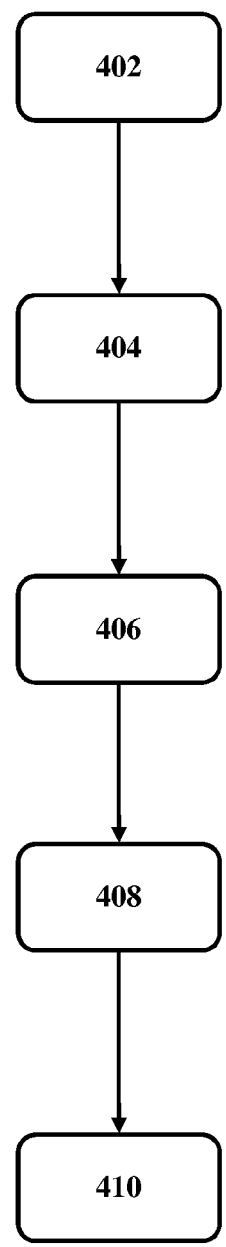

An embodiment of the disclosure is described with reference to the following accompanying drawings, FIG. 1 illustrates a side view of the system to define and identify an absolute mechanical reference position for a rotating element, according to an embodiment of the present disclosure, FIG. 2 illustrates a top view of the system to define and identify the absolute mechanical reference position for the rotating element, according to an embodiment of the present disclosure, FIG. 3 illustrates a flow diagram for defining the absolute mechanical reference position for the rotating element, according to an embodiment of the present disclosure, and FIG. 4 illustrates a flow diagram for identifying the absolute mechanical reference position of the rotating element, according to an embodiment of the present disclosure.

DETAILED DESCRIPTION OF THE EMBODIMENTS

FIG. 1 illustrates a side view of the system to define and identify an absolute mechanical reference position for a rotating element, according to an embodiment of the present disclosure. The system 100 comprises a ring magnet 106 mounted to a rotating element 104. The ring magnet 106 comprises plurality of pole pairs and is a radial ring magnet 106. A first magnetic sensor 102 is provided in proximity of the ring magnet 106 to detect angular position of the rotating element 104. Also, at least one second magnetic sensor 108 is provided in proximity of the ring magnet 106 to detect the passage of each of the plurality of pole pairs. The system 100 further comprises a control module 110 adapted to define the absolute mechanical reference position by computing a unique first set of feature values for each of the plurality of pole pairs based on the responses of the first magnetic sensor 102 and the second magnetic sensor 108. The first set of feature values is stored in a memory unit 112. The control module 110 is further adapted to compute a second set of feature value based on responses of the first magnetic sensor 102 and the second magnetic sensor 108. The control module 110 is still further adapted to compare the second set of feature values with the first set of feature values, and identify each of said plurality of pole pairs of the ring magnet 106.

In accordance to an embodiment of the present disclosure, the ring magnet 106 comprises plurality of magnets arranged in a circular form. Alternatively, a magnetic ring comprising plurality of magnets arranged in circular form is used. The plurality of magnet is further arranged in alternative North and South poles. The plurality of poles in the ring magnet 106 is magnetized in an axial or in radial direction.

In accordance to an embodiment of the present disclosure, the ring magnet 106 is mounted to a rotor of an electric machine, and wherein number of pole pairs of the ring magnet 106 is equal to number of pole pairs in a field magnet of the electric machine.

In accordance to yet another embodiment of the present disclosure, the first magnetic sensor 102 and at least one second magnetic sensor 108 are selected from a group of sensors showing at least one property comprising a Anisotropic Magneto Resistance (AMR), Giant Magneto Resistance (GMR), Tunnel Magneto Resistance (TMR), Colossal Magneto Resistance (CMR), Extraordinary Magneto Resistance (EMR), Hall Effect, and the like.

In accordance to an embodiment of the present disclosure, the first magnetic sensor 102 and the second magnetic sensor 108 is further selected from a group comprising an analog sensor and a digital sensor. The analog sensor provides Sine and Cosine signals, which are used to determine the electrical or mechanical position information of the rotating element 104. On the other hand the digital sensor provides pulses, which are used to detect the passage of each of the plurality of pole pairs.

In accordance to yet another embodiment of the present disclosure, the first magnetic sensor 102 and at least one second magnetic sensor 108 is mounted along the periphery of the ring magnet 106 at a predetermined distance, so that a required strength of the response or output signal is obtained or measured. At any instant of time, each of the first magnetic sensor 102 and the second magnetic sensor 108 senses different pole pair magnets of the ring magnet 106, i.e. different electrical period is measured by each of two magnetic sensors. Further, the first magnetic sensor 102 and at least one second magnetic sensor 108 are allowed to be arranged in any order around the periphery of the ring magnet 106 and must not be limited to what is shown in the FIG. 1.

In accordance to an embodiment of the present disclosure, the feature values are calculated by taking arc-length ratio of two pole pairs which are facing the first magnetic sensor 102 and the second magnetic sensor 108. The computation of feature values is started as per the request from a user on a constant speed of the rotating element 104. Based on the position of the rotating element 104 during startup, the first electrical period to which the first magnetic sensor 102 and/or the second magnetic sensor 108 points to is assumed/considered to be the first electrical period for the first pole pair of the ring magnet 106. But since different electrical period has different harmonics due to the in-homogeneity in the ring magnet 106, a starting electrical period is defined as reference. By identifying the reference electrical period, harmonic compensation is synchronized to the same electrical period during every startup cycle of the rotating element 104.

In accordance to an embodiment of the present disclosure, the first feature value is obtained by taking ratio of at least two magnetic sensors through respective first responses. The first feature value is then assigned to that pole pair, to which the first magnetic sensor 102 obtained the first response from. Similarly, the feature values are assigned to the each of the remaining plurality of pole pair of the ring magnet 106. Once the feature values are obtained for all the pole pairs, then the position of the rotating element 104 is said to be defined or calibrated with respect to the ring magnet 106.

In accordance to an embodiment of the present disclosure, the arc-length ratio of two electrical period measured by first magnetic sensor 102 and the second magnetic sensor 108 at the same time is unique for each of the plurality of pole pair due to the in-homogeneity of the ring magnet 106. The arc-length for a pair of pole magnets (North-South) is evaluated based on the time taken to traverse the either of the first magnetic sensor 102 or the second magnetic sensor 108. The arc-length from the digital sensor is measured by measuring time between two consecutive rising edges or falling edges. Similarly, the arc-length based on analog sensor is measured by measuring time between two consecutive positive or negative zero crossing of the Sine or the Cosine signals.

In accordance to an exemplary embodiment of the present disclosure, the system 100 to define and identify the absolute mechanical reference position is mounted to an electric machine such as electric motor, electric generator, alternator, and the like. The ring magnet 106 is connected to the rotor shaft of the electric machine. In this example, the rotor shaft is the rotating element 104. Since there is a one to one mapping between number of pole pairs of the ring magnet 106 and the number of pole pairs of the electrical machine, the system 100 directly senses the electrical angle of the electrical machine. Considering an electrical machine with eight pole pairs, then the ring magnet 106 also comprises eight pole pairs. The system 100 comprises a TMR sensor as a first magnetic sensor 102 and a Hall Effect sensor as a second magnetic sensor 108. Thus, at constant speed, and in one revolution, eight feature values are computed or calculated corresponding to eight pole pairs. The feature values of the pole pairs are the function of output of the TMR sensor and the Hall Effect sensor. The feature value of each pole pair corresponds to arc-length ratio of the two electrical periods at the same time as sensed by the TMR sensor and the Hall Effect sensor. Each of the calculated feature values is unique due to in-homogeneity of the ring magnet 106 with different length of the pole pairs. Based on the calculated feature values, either a number or the feature value itself is assigned to each of the pole pairs of the ring magnet 106. Alternatively, the feature values are assigned to the electrical period due to the pole pairs. The evaluated feature values and the specific number is stored in a memory unit 112 such as but not limited to Electrically Erasable Programmable Read-Only Memory (EEPROM), Non-volatile random-access memory (NV RAM) and the like.

FIG. 2 illustrates a top view of the system to define and identify the absolute mechanical reference position for the rotating element, according to an embodiment of the present disclosure. The system 100 comprises a device to define and identify an absolute mechanical reference position for the rotating element 104. The rotating element 104 is mounted with a ring magnet 106 comprising plurality of pole pairs. Also at least two magnetic sensors 102 and 108 are arranged in proximity to the ring magnet 106. The device comprises a control module 110 adapted to define the absolute mechanical reference position by computing a unique first set of feature values for each of the plurality of pole pairs based on responses of the at least two magnetic sensors 102, 108. The first set of feature values is stored in the memory unit 112. The control module 110 is further adapted to compute a second set of feature value based on responses of the at least two magnetic sensors 102, 108. The control module 110 is still further adapted to compare the second set of feature values with the first set of feature values, and identify each of the plurality of pole pairs of the ring magnet 106.

In accordance to an embodiment of the present disclosure, a device to compute noise induced in a response of a magnetic sensor arranged in association with a ring magnet 106 mounted to a rotating element 104 is provided. The magnetic sensor is an analog sensor which is used to provide position of the rotating element 104. The ring magnet 106 comprises plurality of pole pairs. The at least one magnetic sensor is used to detect a position of the rotating element 104. Before beginning with defining the absolute mechanical reference position for the rotating element 104, the noise values are either stored from test or experimental results or the device itself computes the noise values. The device comprises a memory unit 112 to store ideal response of at least one magnetic sensor for each of the plurality of pole pair of the ring magnet 106. The device further comprises the control module 110 in communication with the memory unit 112. The control module 110 receives a run-time response of at least one magnetic sensor for each of the plurality of pole pairs of the ring magnet 106. The control module 110 computes noise in the run-time response for each of the plurality of pole pairs of the ring magnet 106 by applying a signal processing technique known in the art. The signal processing technique such as but not limited to Fast Fourier Transform is applied to both the responses and the noise values are obtained. The noise value is then stored in the memory unit 112 for further usage. The noise corresponds to any distortion or harmonics or any other unwanted signal.

In accordance to an embodiment of the present disclosure, the feature value corresponds to ratio of arc-lengths of two different pole pairs as measured by the first magnetic sensor 102 and the second magnetic sensor 108 at the same time. The arc-length is evaluated based on time taken by each of the pole pair to traverse the first magnetic sensor 102 and the second magnetic sensor 108.

In accordance to another embodiment of the present disclosure, the first response signal of the first magnetic sensor 102 for any one of the plurality of pole pairs is considered as response for a first pole pair, during defining the absolute mechanical reference position for the rotating element 104. The first pole pair is assigned a first unique feature value followed by calculation of remaining feature values and assigning to remaining pole pairs.

In accordance to an embodiment of the present disclosure, the device is also adapted to compensate the noise induced in the run-time response of at least one magnetic sensor based on the noise values stored in the memory unit 112. After the identification of each of the plurality of pole pairs by respective feature values, the device applies respective noise/harmonic compensation values to the real-time response obtained from at least one magnetic sensor, i.e. the analog sensor.

In accordance to an embodiment of the present disclosure, the control module 110 is adapted to only define the absolute mechanical reference position. Alternatively, the control module 110 is adapted to only identify the absolute mechanical reference position. Alternatively, the control module 110 is adapted to only compute noise/harmonics in the run-time response/signal of at least one magnetic sensor. Alternatively, the control module 110 is adapted to compensate the noise in the run-time response/signal of at least one magnetic sensor. Alternatively, the control module 110 is adapted to perform at least one of the aforementioned process comprising defining/calibrating, noise computation, identifying, and harmonic compensation.

FIG. 3 illustrates a flow diagram for defining the absolute mechanical reference position for the rotating element, according to an embodiment of the present disclosure. The rotating element 104 is mounted with a ring magnet 106 comprising plurality of pole pairs, and at least two magnetic sensors are arranged in association with said ring magnet 106. The method comprises the step 302 to rotate the rotating element 104 by a source. The source is either externally applied or provided by the engine of a vehicle. The step 304 comprises measuring a run-time response for each of the pole pairs of the ring magnet 106 by the first magnetic sensor 102 and the second magnetic sensor 108. The first response as measured by at least one magnetic sensor is considered to be for a first pole pair. The step 306 comprises computing a feature value based on responses of the first magnetic sensor 102 and the second magnetic sensor 108 for each of the plurality of pole pairs.

In accordance to an embodiment of the present disclosure, the feature value is computed by taking ratio of arc-lengths of two different pole pairs as measured by the first magnetic sensor 102 and the second magnetic sensor 108 at the same time.

FIG. 4 illustrates a flow diagram for identifying the absolute mechanical reference position of the rotating element, according to an embodiment of the present disclosure. The rotating element 104 is mounted with a ring magnet 106 with plurality of poles, and at least two magnetic sensors 102, 108 are arranged in proximity to the ring magnet 106. The method comprises a step 402 for measuring run-time responses by the first magnetic sensor 102 and the second magnetic sensor 108 of the at least two magnetic sensors for each of the plurality of pole pairs of the ring magnet 106. The step 404 comprises computing a second set of feature values based on measured responses of the first magnetic sensor 102 and the second magnetic sensor 108. The step 406 comprises retrieving a first set of stored feature values for each of the plurality of pole pairs of the ring magnet 106 measured with the first magnetic sensor 102 and the second magnetic sensor 108. The first set of feature values is stored in the memory unit 112 during the phase when the device defines or calibrates the absolute mechanical reference position. The step 408 comprises comparing the first set of feature values with the second set of feature values. The step 410 comprises identifying the pole pairs based on the comparison.

In accordance to an embodiment of the present disclosure, after identifying each of the pole pairs of the ring magnet 106, the device further synchronizes angular position and harmonic compensation to the identified position for every start up phase. Also, for the harmonics induced in the electrical period due to the plurality of pole pairs, a respective harmonic compensation is applied. Alternatively, the harmonics are compensated for the synchronized absolute mechanical reference position/angle or also on the absolute electrical angle which is derived back from the absolute mechanical angle.

In accordance to an embodiment of the present disclosure, the first set of feature value signifies ratios of arc-lengths of two different pole pairs as measured by the first magnetic sensor 102 and the second magnetic sensor 108 at the same time. The feature values are stored in memory unit 112 during defining an absolute mechanical reference position.

In accordance to an embodiment of the present disclosure, the system 100 and device assists in defining a mechanical reference position using the ring magnet 106 which helps to detect accurate position of the rotating element 104, resulting in proper harmonics compensation. The absolute mechanical reference position is independent of speed. Further, the aforementioned process and device provides a low cost solution with high precision results. The system 100 also provides a combination or configuration of an analog sensor comprising magnetoresistive sensors such as AMR, GMR, TMR, etc, and a digital sensor such as Hall Effect sensor. The system 100 also functions by using only two magnetoresistive sensors. The system 100 further functions with a combination of three, four and more magnetic sensors.

It should be understood that embodiments explained in the description above are only illustrative and do not limit the scope of this invention. Many such embodiments and other modifications and changes in the embodiment explained in the description are envisaged. The scope of the invention is only limited by the scope of the claims.

We claim:

1. A system to define and identify an absolute mechanical reference position for a rotating element, the rotating element being a rotor shaft of an electric machine, the system comprising:
   a radial ring magnet having a plurality of pole pairs mounted to the rotating element;
   a first magnetic sensor arranged in proximity of the radial ring magnet and configured to detect an angular position of the rotating element;
   at least one second magnetic sensor arranged in proximity of the radial ring magnet and configured to detect passage of each pole pair in the plurality of pole pairs, the first magnetic sensor and the at least one second magnetic sensor sensing different pole pairs of the radial ring magnet; and
   a control module configured to (i) define the absolute mechanical position by computing a unique first set of feature values for each pole pair in the plurality of pole pairs based on responses of the first magnetic sensor and the second magnetic sensor, (ii) store the first set of feature values in a memory unit, (iii) compute a second set of feature values based on the responses of the first magnetic sensor and the second magnetic sensor, (iv) compare the second set of feature values with the first set of feature values, and (v) identify each pole pair in the plurality of pole pairs based on the comparison.

2. The system as claimed in claim 1, wherein the radial ring magnet is mounted to a rotor of an electric machine, a number of pole pairs of the radial ring magnet being equal to a number of pole pairs in a field magnet of the electric machine.

3. The system as claimed in claim 1, wherein the first magnetic sensor and the at least one second magnetic sensor are selected from a group of sensors showing at least one property including a Anisotropic Magneto Resistance (AMR), Giant Magneto Resistance (GMR), Tunnel Magneto Resistance (TMR), Colossal Magneto Resistance (CMR), Extraordinary Magneto Resistance (EMR), and Hall Effect.

4. The system as claimed in claim 1, wherein the first set of feature values corresponds to a ratio of arc-lengths of two different pole pairs in the plurality of pole pairs as measured by the first magnetic sensor and the at least one second magnetic sensor at the same time, and the arc-length being evaluated based on time taken by each pole pair in the plurality of pole pairs to traverse the first magnetic sensor and the second magnetic sensor.

5. The system as claimed in claim 1, wherein a first response signal of the first magnetic sensor for any pole pair in the plurality of pole pairs is considered as a response for a first pole pair during defining of the absolute mechanical reference position for the rotating element, wherein the first pole pair is assigned a first unique feature value followed by assigning subsequent pole pairs.

6. A method for defining an absolute mechanical reference position for a rotating element, the rotating element being mounted with a ring magnet having a plurality of pole pairs, at least two magnetic sensors being arranged in association with the ring magnet, the method comprising:
rotating the rotating element using a source;
measuring a run-time response for each pole pair in the plurality of pole pairs of the ring magnet using at least a first magnetic sensor of the at least two magnetic sensors and a second magnetic sensor of the at least two magnetic sensors, a first response as measured by the at least two magnetic sensor being considered to be for a first pole pair in the plurality of pole pairs; and
computing and storing a first feature value based on the run-time responses of the first magnetic sensor and the second magnetic sensor for each of the pole pairs.

7. The method according to claim 6, further comprising:
computing a second set of feature values based on measured responses of the first magnetic sensor and the second magnetic sensor for each of the pole pairs;
retrieving the stored first set of feature values for each pole pair of the ring magnet measured with the first magnetic sensor and the second magnetic sensor;
comparing the first set of feature values with the second set of feature values; and
identifying the pole pairs based on the comparison.

8. The method as claimed in claim 7, wherein the first set of feature value signifies ratios of arc-lengths of two different pole pairs in the plurality of pole pairs as measured by the first magnetic sensor and the second magnetic sensor at the same time and stored in a memory unit during defining of an absolute mechanical reference position.

9. The method as claimed in claim 7, wherein the feature value is computed by taking ratio of arc-lengths of two different pole pairs as measured by the first magnetic sensor and the second magnetic sensor at the same time, and wherein the arc-length is evaluated based on time taken by each of the pole pair to traverse the first magnetic sensor and the second magnetic sensor.

* * * * *